(12) United States Patent
Von Känel et al.

(10) Patent No.: US 6,918,352 B2
(45) Date of Patent: Jul. 19, 2005

(54) METHOD FOR PRODUCING COATED WORKPIECES, USES AND INSTALLATION FOR THE METHOD

(75) Inventors: Hans Von Känel, Wallisellen (CH); Carsten Rosenblad, Zürich (CH); Jurgen Ramm, Sevelen (CH)

(73) Assignee: Unaxis Trading AG, Trübbach (CH)

( * ) Notice: Subject to any disclaimer, the term of this patent is extended or adjusted under 35 U.S.C. 154(b) by 0 days.

(21) Appl. No.: 10/199,050

(22) Filed: Jul. 22, 2002

(65) Prior Publication Data

US 2003/0005879 A1 Jan. 9, 2003

Related U.S. Application Data

(62) Division of application No. 09/460,210, filed as application No. PCT/CH98/00221 on May 27, 1998, now Pat. No. 6,454,855.

(30) Foreign Application Priority Data

Jun. 13, 1997 (CH) .............................................. 1445/97

(51) Int. Cl.$^7$ ............................................. C23C 16/00
(52) U.S. Cl. ........................ 118/723 DC; 118/723 HC; 118/723 E
(58) Field of Search ................... 118/723 DC, 723 HC, 118/723 CB, 723 EB, 723 FI, 723 FE, 723 E; 117/92, 103, 108

(56) References Cited

U.S. PATENT DOCUMENTS

| | | | | |
|---|---|---|---|---|
| 4,440,108 A | * | 4/1984 | Little et al. | ................... 118/719 |
| 4,443,488 A | | 4/1984 | Little et al. | |
| 4,488,506 A | * | 12/1984 | Heinecke et al. | ........... 118/667 |
| 4,749,587 A | * | 6/1988 | Bergmann et al. | ........... 427/570 |
| 4,989,544 A | * | 2/1991 | Yoshikawa | ........... 118/723 MP |
| 5,009,922 A | * | 4/1991 | Harano et al. | ............... 427/571 |
| 5,052,339 A | * | 10/1991 | Vakerlis et al. | ........... 118/723 E |
| 5,104,509 A | * | 4/1992 | Buck et al. | ............. 204/192.38 |
| 5,384,018 A | * | 1/1995 | Ramm et al. | ........... 204/192.38 |
| 5,554,222 A | | 9/1996 | Nishihara et al. | |
| 5,580,420 A | * | 12/1996 | Watanabe et al. | .............. 216/69 |
| 5,730,808 A | * | 3/1998 | Yang et al. | .................. 136/249 |
| 5,952,061 A | * | 9/1999 | Yoshida et al. | ............. 427/580 |
| 6,139,964 A | * | 10/2000 | Sathrum et al. | ............. 428/408 |

FOREIGN PATENT DOCUMENTS

| | | |
|---|---|---|
| DE | 36 14 384 | 1/1987 |
| GB | 2 219 578 | 12/1989 |

OTHER PUBLICATIONS

"Plasma–Enhanced Chemical Vapor Deposition of Epitaxial Silicon From Silane", S.R. Shanfield, Ext. Abstracts, vol. 83–1, 1983, pp. 230–231, XP002056339, no month.

"Low Temperature Deposition of Microcrystalline Silicon In A Multipolar Plasma", T.D. Mantei et al. Ext. Abstr., vol. 85, No. 2, 1985, pp. 396–397, XP002056340, no month.

"Plasma–Assisted CVD of Diamond Films By Hollow Cathode ARC Discharge" Diamond and Related Materials, vol., 2, No. 2/04, Mar. 31, 1993, pp. 413–416, XP000360820.

(Continued)

*Primary Examiner*—Parviz Hassanzadeh
(74) *Attorney, Agent, or Firm*—Crowell & Moring LLP (57) ABSTRACT

A system and a method produce workpieces coated by PECVD with a quality sufficient for epitaxy. Included are a vacuum recipient, a plasma discharge source operationally connected to the vacuum recipient and a workpiece holder within the vacuum recipient, said plasma discharge source generating on said workpiece holder ions with an energy of below 15 eV. The plasma discharge source can be a low-voltage plasma discharge source in which at least one cathode is arranged within a cathode chamber coupled to the vacuum recipient by a diaphragm.

40 Claims, 4 Drawing Sheets

OTHER PUBLICATIONS

"Silicon from silane through plasma deposition", S.J. Solomon, Fifteenth IEEE Photovoltaic Specialists Conf.—1981, Kissimmee, FL May 12–15, 1981, pp. 569–571, XP002056341 1981, New York, NY, USA, IEEE.

"Hydrogen plasma chemical cleaning of metallic substrates and silicon wafers", $22^{nd}$ Int'l Conf. On Metallurgical Coating and Thin Films, San Francisco, CA Apr. 24–28, 1995, vol. 77 No. 1–3, pp 731–737 XP002056342., ISSN 0257–8972, Surface and Coatings Tech., Dec. 1995, Elsevier, Switzerland.

"Hollow Cathode Plasma Assisted Chemical Vapor Deposition of Diamond", B. Singh et al., Applied Physics Letters, vol. 52, No. 20, May 16, 1988, pp. 1658–1660, XP000119536, see p. 1658, right–hand column, line 3–p. 1659, right–hand column, line 32.

"Low Temperature Plasma–Enhanced Epitaxy of GaAs", Journal of the Electrtochemical Society, vol. 131, No. 6, Jun. 1984, pp. 1357–1359, XP002056343, US, see p. 1357, left–hand column, line 32–p. 1358, left–hand column, line 17.

* cited by examiner

METHOD FOR PRODUCING COATED WORKPIECES, USES AND INSTALLATION FOR THE METHOD

This application is a DIV of Ser. No. 09/460,210 filed on Dec. 13, 1999 now U.S. Pat. No. 6,454,855 which is a 371 of PCT/CH98/00221 filed on May 27, 1998.

The present invention relates to a method for producing coated workpieces to uses therefore, to an installation for implementing the above-mentioned method and to uses therefore.

The present invention is based on problems which occur during the manufacturing of thin layers by means of CVD and PECVD methods. The findings made in this case, according to the invention, can be applied particularly to the production of semiconductor layers, for example, when producing solar cells or modulation doped FETs or hetero-bipolar transistors.

Thin semiconductor films are deposited either in a monocrystalline form, that is, epitaxially, on an also monocrystalline substrate, such as a silicon substrate, or are deposited in a polycrystalline form or amorphous form on polycrystalline or amorphous substrates, such as glass. Although in the following the invention will be described mainly with respect to the production of silicon-coated and/or germanium-coated substrates, it may, as mentioned above, also be used for the production of other workpieces and workpieces coated with other materials.

Known methods for depositing epitaxial semiconductor films are:
- Molecular beam epitaxy (MBE),
- chemical vapor deposition (CVD),
- remote plasma enhanced CVD with DC or HF discharge,
- electron cyclotron resonance plasma-assisted CVD. (ECRCVD).

"CVD method" is a collective term for a large number of thermal deposition methods which differ either in the construction of the assigned apparatuses or in their operating mode. Thus, for example, a CVD method can be carried out at a normal atmospheric pressure or at much lower pressures down into the range of the ultra high vacuum. Reference can be made in this respect to (1) as well as to (2).

In the commercial production of epitaxial Si layers, only CVD is normally used. In this case, the applied reactive gases are silicon-containing gases, such as silane chlorides, $SiCl_4$, Si, HCl and $SiH_2Cl_2$ as well as silanes, such as $SiH_4$, or $Si_2H_4$. Characteristics of the standard CVD methods are the high deposition temperatures in the order of 1,000° and more, as well as pressures of typically 20 mbar to 1,000 mbar, that is, to normal atmospheric pressure.

According to the process conditions, coating rates of several $\mu$m per minute can be achieved in this manner. corresponding to several 100 Å/sec., with respect to which reference is again made to (1).

In contrast, low pressure chemical vapor deposition (LPCVD), which is synonymous with low pressure vapor phase epitaxy (LPVPE), takes place at pressures below 1 mbar and permits lower process temperatures to typically 700° C. In this respect, reference is made, in addition to (1), also to (3) and (6).

With respect to the LPCVD and with reference to (6), at a deposition temperature of 650° c., a growth rate of $GR=50$ Å/min is indicated. This takes place at a reactive gas flow for silane of $F=14$ sccm.

This results in a characteristic number which is relevant to the gas yield, specifically the growth rate per reactive gas flow unit $GR_F$ at $GR_F=3.6$ Å/(sccm·min)

On 5" wafers, corresponding to a surface $A_S=123$ cm$^2$, converted from the actual surface $A_2$ for 2" wafers, a deposition quantity (growth amount) GA is obtained at $GA=5.2 \cdot 10^{14}$ Si atoms/sec.

Again, with respect to a reactive gas flow unit, the characteristic number "deposition quantity per reactive gas flow unit", in the following called "gas utilization number", $GA_F$ is obtained at $GA_F=8.4 \cdot 10^{-3}$, corresponding to 8.4 o/oo.

At 650°, an epitaxial layer is formed.

If the deposition temperature is reduced to 600° C., a polycrystalline layer is formed. In this case, the following applies:

$GR=3$ Å/min $F=28$ sccm silane $GR_F=0.11$ Å/sccm/min)

$GA=3.1 \cdot 10^{15}$ Si atoms/sec on $A_R$ $GA_F=2.5 \cdot 10^{-4}$, corresponding to 0.25 o/oo.

Basically, the following criteria are required for a defect-free epitaxial layer growth:
- In the case of transmission electron microscopy on cross-sectional preparations, the proof of epitaxy is established by electron diffraction and high resolution.
- In the area of 10 to 15 $\mu$m, which in this case can typically be penetrated by radiation, along the boundary surface to the substrate, no defects must be visible. Typical enlargements in the analysis of defects are 110,000 to 220,000.

Another development is the ultra high vacuum chemical vapor deposition (UHV-CVD) with working pressures in the range of $10^{-4}$ to $10^{-2}$ mbar, typically in the range of $10^{-3}$ mbar, with respect to which reference is made to (4) as well as to (5), (7). It permits very low workpiece temperatures; however, the growth rates or coating rates being extremely low; thus, for example, approximately 3 Å/min for pure silicon at 550° C. according to (5).

The reason for the low growth rates is the fact that the absorption rate and decomposition rate of the reactive molecules, thus, for example, of $SiH_4$, decreases with an increasing hydrogen coating of the workpiece surface. The layer growth is therefore limited by the desorption rate of $H_2$, which, however, rises exponentially with the temperature. In this respect, reference is made to (8). Because of the lower bonding energy of the Ge—H bonding in comparison to the Si—H bonding, the hydrogen desorption of an Si—Ge alloy surface is higher, so that, while the substrate temperature is the same, a higher growth rate is obtained than in the case of pure Si; for example, at a content of 10% Ge by a factor 25 at 550° C. (5).

Another possibility of achieving high deposition rates of an epitaxy quality at low substrate temperatures consists of (9) decomposing the reactive gases by means of a u-wave plasma (ECRCVD).

By the use of plasma sources, which are based on the principle of electron cyclotron resonance, the incidence of high-energy ions onto the substrate is to be avoided.

As a rule, such sources operate in the pressure range of $10^{-3}$ to $10^{-4}$ mbar, which, however, results in larger free path lengths than in the case of capacitively coupled-in high-frequency Hf plasmas. This, in turn, can lead to an undesirable ion bombardment of the substrate and thus to the generating of defects, as indicated in (10). The energy of the ions impacting on the substrate, however, can be limited by an external control of the substrate potential, whereby ion-related damage can largely be avoided. Also by means of the ECRCVD method, the growth rates for pure silicon, as a rule, amount only to a few 10 Å/min, at low deposition temperatures $\leq 600°$ C.

Summarizing, this results in the following:

Layers which are deposited with a quality which is suitable also for the depositing of epitaxial layers can be deposited at deposition temperatures $\leq$ up to now:

by UHV-CVD with growth rates GR of approximately 3 Å/min or

ECRCVD with a growth rate GR higher by approximately 1 order (30 Å/min).

PECVD methods, whose plasmas are produced by DC discharges, could be used for the manufacturing of layers of epitaxy quality—that is, a correspondingly lower fault density (see above)—neither for the construction of epitaxial nor for the construction of amorphous or polycrystalline layers; at least not with a growth rate GR, reliability and efficiency to be ensured for industrial manufacturing.

On the other hand, the use of capacitively coupled-in high-frequency fields for generating HF plasmas for PECVD methods was reported very early, with respect to which reference is made to (11). The difficulty of this approach is the fact that not only the reactive gases are decomposed in such Hf plasmas. Simultaneously, the substrate surface is exposed to an intensive bombardment of highly energetic ions, as utilized specifically also in the case of reactive atomizing or high-frequency etching. This, on the one hand, promotes the hydrogen desorption but, simultaneously results in defects in the growing layers. A method, which is modified in this respect, the RPCVD—remote plasma chemical vapor deposition—takes this into account in that the substrates to be coated are not exposed directly to the HF plasma, which leads to better results (12). However, the achieved growth rates are low, specifically usually fractions of nm per minute to no more than several nm per minute according to (13).

It is an object of the present invention to indicate a method which can be used in industrial manufacturing and which permits the growing of layers of an epitaxy quality which have significantly higher growth rates than previously known.

This is achieved by methods of the initially mentioned type and by a system which is characterized. The method according to the invention is particularly suitable for the manufacturing of semiconductor-coated substrates with an epitaxial, amorphous or polycrystalline layer, in this case particularly of Si, Ge or Si/Ge alloy layers as well as Ga or Ga bonding layers.

In this case, particularly also doped semiconductor layers can be deposited; layers containing silicon and/or germanium, doped preferably with at least one element of Groups III or V of the classification of elements or layers containing gallium with at least one element of Groups II, III, IV or VI of the classification of elements, for example, with Mg or Si.

Concerning the initially discussed coating techniques for producing epitaxial layers, the following can be summarized:

The CVD methods, particularly the UHV-CVD methods, lead to excellent layer qualities even at substrate temperatures below 500° C. They are therefore suitable for also producing epitaxial layers, where extremely high demands are made on the layer quality. However, in the case of this method, the growth rate, for example, for Si, is extremely low, as mentioned above, in the order of 3 Å/min at 550° C.

Microwave-plasma-assisted methods, ECRCVD, have the advantage that the decomposition of the reactive molecules can take place without high thermal energy. The ion bombardment of the substrate leads to an increased hydrogen desorption. Both effects can result in a considerable increase of the growth rate. However, at low temperatures, unacceptably high defect densities are observed which are induced by the ion bombardment. Although a control by way of the substrate bias voltage increases the layer quality, it does not change the comparatively low rates.

Thus, there seems to be an inherent contradiction: An ion bombardment of the substrate, on the one hand, leads to an increased growth rate because of an increased hydrogen absorption, but simultaneously increases the defect density.

The following picture exists according to (2) for thermal CVD methods operated at atmospheric pressure:

Si growth rate GR: $2 \times 10^{-3}$ nm/min (at 600° C., measured $3 \cdot 10^{-2}$ and converted to 550° C.)

Gas flow, $SiCl_2H_2$, F: 100 sccm.

This results in a growth rate GR per $SiCl_2H_2$ flow unit, $GR_F \approx 2 \times 10^{-4}$ Å/(sccm.min).

A gas flow F of 100 sccm $SiCl_2H_2$ corresponds to $4.4 \times 10^{19}$ molecules/sec.

The growth rate OR of $2 \times 10^{-3}$ nm/mm corresponds to a growth rate of $2 \times 10^{-4}$ silicon monolayers per second on an "5" wafer, corresponding to a surface $A_5$ of 123 cm$^{2\cdot}$ Thus, on the total surface, a deposited quantity of $$GA = 1.7 \times 10^{13} \text{ silicon atoms/sec.}$$

is obtained per second. By relating the silicon quantity deposited per second and the reactive gas quantity admitted per second, the gas utilization number $GA_F$ is obtained at $$GA_F = 3.9 \times 10^{-7}.$$

This corresponds to a utilization of approximately 0.0004 o/oo.

We note that, at atmospheric CVD, the following is obtained:

$$GR_F \approx 2 \times 10^{-4} \text{ Å/(sccm.min)}$$

$$GA_F \approx 0.0004 \text{ o/oo}.$$

From (5), combined with (4) and (7), the following estimate is obtained for UHV-CVD:

$$GR_F \approx 0.1 \text{ Å/(sccm.min) and}$$

$$GA_F \approx 0.0035 \text{ corresponding to approximately 35 o/oo}$$

The above concerns the methods which so far have been used industrially for the production of epitaxy quality layers.

From German Patent Document DE-OS 36 14 384, a PECVD method is known in which DC glow discharge in the form of a low-voltage discharge is used. As the result, layers which have particularly good mechanical characteristics are to be deposited rapidly, that is at a high growth rate.

A cathode chamber with a hot cathode communicates with a vacuum recipient by way of a diaphragm. An anode is provided opposite the diaphragm. In parallel to the discharge axis formed between the diaphragm and the cathode, an inlet arrangement is provided for a reactive gas. Workpieces are arranged opposite this arrangement with respect to the discharge axis. With respect to the anode potential, discharge voltages $U_{AK}$ below 150 V are applied, and the discharge is operated with a current intensity $I_{AK}$ of at least 30 A. For the coating, the workpieces are brought to negative potentials between 48 and 610 V.

The tests illustrated therein result in the following picture:

| Example | GR (Å/min) | $GR_F$ (Å/(sccm.min)) |
|---|---|---|
| 1 | $10^1$ | 2.5 |
| 2 | 380 | 1.2 |
| 3 | $2 \times 10^3$ | 2.5 |
| 4 (Si) | 166 | 0.7 |
| 5 | 466 | 1.2 |
| 6 | 750 | 0.7 |
| 7 | 250 | 0.5 |
| 8 | 500 | 0.75 |
| 9 | 316 | 0.38 |
| 10 | 344 | 0.18 |
| 11 | 62 | 0.18 |
| 12 | 58 | 0.14 |

The present invention is now based on the recognition that workpiece coatings can be carried out which have a layer quality which meets the demands made on epitaxy layers in that, for this purpose, in contrast to previous expectations, a non-microwave-plasma PECVD method is used—that is, a PECVD method with DC discharge—and specifically a PECVD method as known, with respect to its principle, from German Patent Document DE-OS 36 14 348. As will be illustrated, it will be possible to achieve in epitaxy quality:

a) Growth rates GR of at least 150 Å/min, even of at least 600 Å/min;

b) $GR_F$ of at least 7.5 Å/(sccm.min), or even 40 Å/(sccm.min), preferably even 75 Å/(sccm.min), and further c) gas utilization numbers $GA_F$ at least in the range of 5%.

It is recognized that, in the case of the DC-PECVD method used according to the invention, the plasma discharge leads to the lowest-energy ions, also to the lowest-energy electrons, but that the charge carrier density, particularly the electron density at the utilized discharge is very high.

In the following, the invention will be explained by means of figures on the basis of examples.

First, a system according to, for example, German Patent Document DE-OS 36 14 384 can definitely be used for implementing the method according to the invention if it is operated such that the conditions according to the invention are met.

Figure 1:
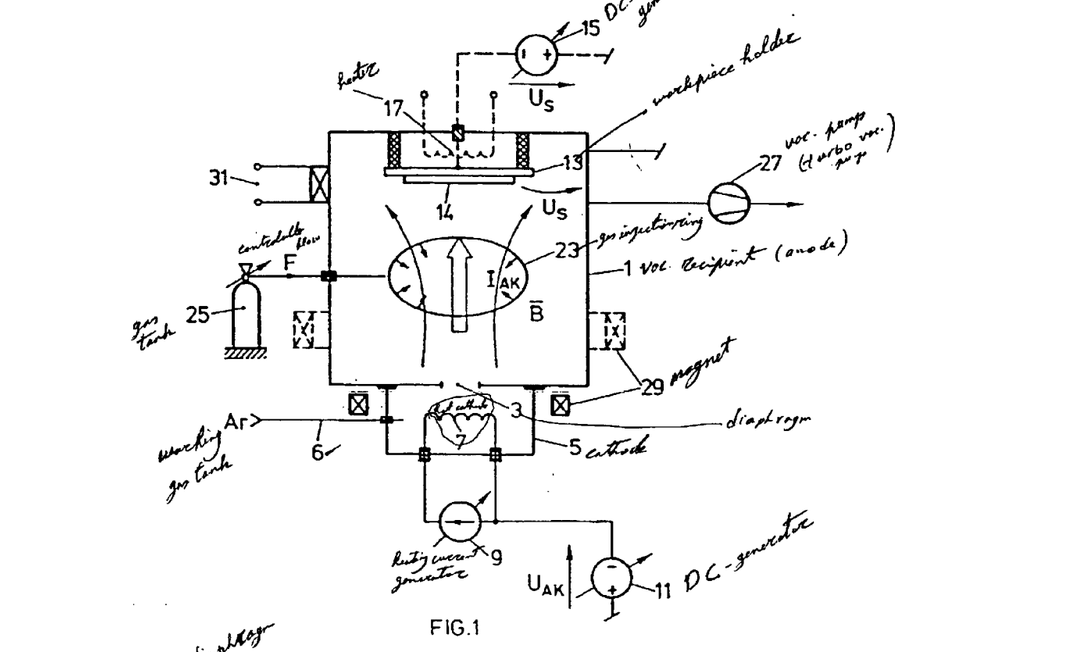
FIG. 1 is a schematic view of a first preferred embodiment of a system according to the invention for implementing the method according to the invention.

According to FIG. 1, a first system, which is currently preferred, for implementing the method according to the invention, has a vacuum recipient 1 to which a cathode chamber 5 is flanged by way of a diaphragm 3. In a known manner, the cathode chamber 5 may be applied to the electric potential of the recipient 1, or the cathode chamber 5 may be insulated with respect to the recipient 1 and be applied to a potential deviating therefrom (not shown).

In the cathode chamber 5, a hot cathode 7—a filament—is provided, preferably heated directly by means of a heating current generator 9.

A workpiece holder 13, which is mounted in an insulated manner, is provided in the diaphragm axis A opposite the diaphragm 3 in the recipient 1. A workpiece heater 17 can be provided in the area of the workpiece holder 13. The recipient 1 is evacuated by means of a vacuum pump 27, preferably a turbo vacuum pump, in this case, particularly a turbo molecular pump. For observation and possibly for control purposes, sensors, such as a plasma monitor, etc. may be provided at a connection 31.

Concentrically to the axis A of the discharge with the discharge current $I_{AK}$, a gas injection ring 23 is provided as a reactive gas injection arrangement connected with a gas tank arrangement 25 for reactive gas which, by means of a controllable flow F (sccm), is admitted into the recipient.

In the cathode chamber 5, a connection 6 leads to a working gas tank, for example, containing Ar. By means of an electromagnet and/or permanent magnet arrangement 29, a magnetic field R is generated essentially concentrically to the axis A in the recipient, particularly also effectively in the area of the diaphragm 3. The field can preferably be displaced from the concentricity.

In its embodiment according to FIG. 1, the system is operated as follows:

The recipient wall corresponding to 1 is used as the anode of the discharge and for this purpose is switched to a reference potential, as illustrated, preferably to the ground. Correspondingly, by means of a preferably adjustable DC generator 11, the cathode 7 is connected to a (negative) potential. By way of the generator 11, the discharge voltage is $U_{AK}$; the discharge current $I_{AK}$ flows between the cathode 7 and the recipient 1.

In a second operating variant of the system illustrated in FIG. 1, the workpiece holder 13 is applied to the voltage $U_S$ by means of a DC bias generator 15.

Figure 2:
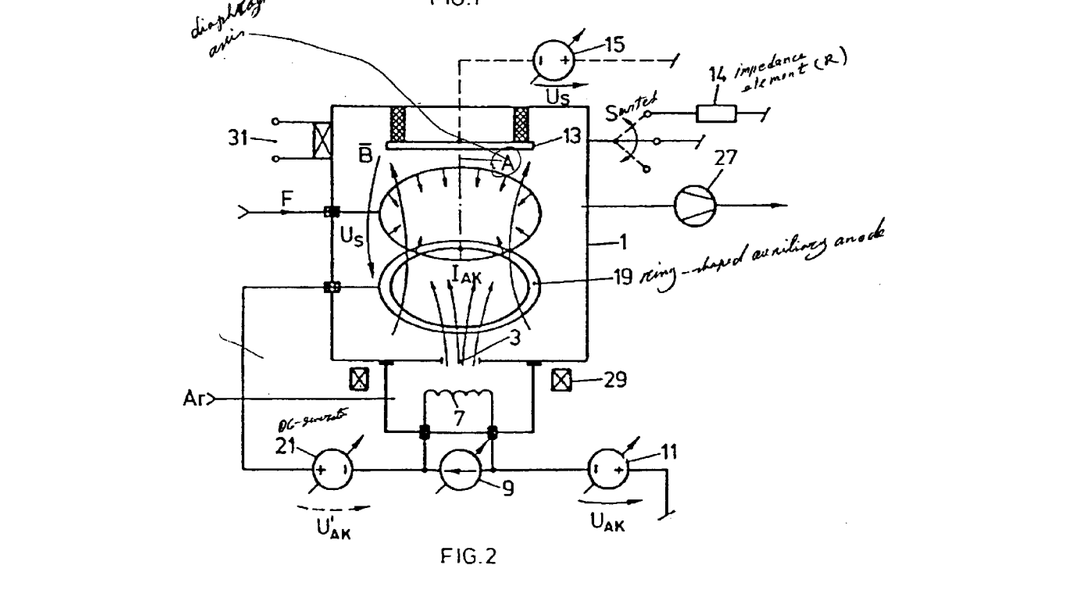
FIG. 2 is a schematic view of a second preferred embodiment of a system according to FIG. 1 with several operating variants.

FIG. 2 shows another preferred system according to the invention for implementing the method according to the invention. The same reference numbers as in FIG. 1 are used for identical parts. The system according to FIG. 2 differs as follows from the system illustrated and described in FIG. 1:

A ring-shaped auxiliary anode 19 is provided which is arranged concentrically to the discharge axis A.

The following operating modes can take place here:

As schematically illustrated by means of the variation switch S, the recipient wall of the recipient 1, as already illustrated in FIG. 1, is applied to a reference potential preferably a ground potential or, by way of an impedance element 14, preferably a resistor element, is anchored to a potential, preferably a reference potential, or is operated in a potential-floating manner. If the recipient 1 is applied to the reference potential, the auxiliary anode 19 is applied either to the potential of the recipient or is applied to voltage by means of a preferably adjustable DC generator 21.

If the recipient 1 is anchored by way of the impedance element 14 to the reference potential, the auxiliary anode is operated by means of the DC generator 21. The discharge voltage $U_{AK}$ appears as illustrated by a broken line between the cathode 7 and the auxiliary anode 19. This is also true when the recipient wall 1 is operated in a potential-floating manner.

Currently, the operation of the system according to FIG. 2 is preferred with the recipient wall connected to the ground and the auxiliary electrode 19 as well as the workpiece holder 13 operated in a potential-controlled manner. In all system variants, the following adjustments are essential:

Total Pressure $P_T$ in the Recipient:

$10^{-4}$ mbar$\leq P_T \leq 10^{-1}$ mbar preferably $10^{-3}$ mbar$\leq P_T \leq 10^{-2}$ mbar typically in the range of 5 $10^{-3}$ mbar. This pressure is mainly ensured by the partial pressure of the working gas, preferably argon. As mentioned above, the vacuum pump 27, for this purpose is preferably constructed as a turbo vacuum pump, particularly a turbo molecular pump.

Working Gas Pressure $P_A$:
This pressure is selected as follows:

$10^{-4}$ mbar$\leq P_A \leq 10^{-1}$ mbar preferably $10^{-1}$ mbar$\leq P_A \leq 10^{-2}$ mbar Reactive Gas Partial Pressure $P_R$:
This pressure is preferably selected as follows:

$10^{-1}$ mbar$<P_R \leq 10^{-1}$ mbar preferably $10^{-4}$ mbar$\leq P_R \leq 10^{-2}$ mbar.

Particularly for silicon-containing and/or germanium-containing gases, partial pressures between $10^{-4}$ mbar and $25 \cdot 10^{-1}$ mbar are advisable. For promoting the (illegible—translator) (surface roughness), mainly for multiple-layer depositions and layers with doping, it is also advisable to additionally provide a hydrogen partial pressure in the order of form $10^{-4}$ to $10^{-1}$ mbar, preferably of approximately $10^{-2}$ mbar.

Gas Flows:
Argon: Largely dependent on recipient volume and cathode chamber volume, for the setting of the required partial pressure $P_A$ and $P_T$.

Reactive gas flow: 1 to 100 sccm, particularly for silicon-containing and/or germanium-containing gases:

$H_2$: 1 to 100 sccm.

Discharge Voltage $U_{AK}$:
The discharge voltage, whether between the cathode 7 and the recipient 1 according to FIG. 1 or between the cathode 7, the recipient 1 and the auxiliary cathode 19 or between the cathode 7 and the auxiliary anode 19, is set as follows:

10 V$\leq U_{AK} \leq$80 V, preferably

20 V$\leq U_{AK} \leq$35 V.

Discharge Currents, $I_{AK}$:
These are selected as follows:

5 A$\leq I_{AK} \leq$400 A, preferably

20 A$\leq I_{AK} \leq$100 A.

Workpiece Voltage $U_S$:
In each case, this voltage is selected below the sputtering threshold of the discharge. It is set in all cases as follows:

$-25$ V$\leq U_S \leq +25$ V, preferably for Ga bonding, preferably for Si, Ge and their bonds $-20$ V$\leq U_S \leq 20$ V, preferably negative, and in this case preferably $-15$ V$\leq U_S < -3$ V.

Current Density at the Site of the Workpiece Surfaces to Be Coated:

This density is first measured by means of a probe at the site where then the surface to be coated will be positioned. It is set relative to the probe surface at at least 0.05 A/cm$^2$, preferably at least 0.1 A/cm$^2$ to maximally discharge current/substrate surface.

This current density is measured and set as follows:
One or several probes are positioned at the site of the surface which will be coated and, with respect to the ground or anode potential, are connected to variable positive voltage. This voltage is increased until the measured current does not continue to rise. Relative to the probe surface, the measured current value indicates the entire current density. This current density will then be set to the required value by adjusting the discharge. The setting of the above-mentioned current density values can easily be carried out by means of the preferably set discharge currents $I_{AK}$ between 5 and 400 A, or and preferably between 20 and 100 A.

The high flux of low-energy ions and electrons which impact on the workpiece is a characteristic of the method according to the invention, which is therefore abbreviated LEPECVD for "Low Energy Plasma Enhanced CVD".

During the coating, silicon and/or germanium layers can be doped by the addition of a doping gas with an element of Group III or V of the Classification of Elements, such as phosphine, boroethane, arsine, etc. to form n-conductive or p-conductive layers. Thus, p/n semiconductor transitions can be produced in situ, for example, particularly economically for the manufacturing of solar cells.

When gallium layers or gallium bonding layers are deposited, these can be doped by using a doping gas with an element of Groups II or III or IV or VI of the Classification of Elements, for example, with Mg or Si.

By means of the anode 19 and/or the magnetic field B, the low-voltage discharge can be compressed and/or can be deflected with respect to the workpiece holder 13. As the result, the plasma density at the workpiece holder can be increased (rate) and/or can be varied over a large range (adjustment of the distribution) or can be wobbled or deflected in a controlled manner. By means of the heater 17, the workpieces and substrates can be heated independently of the ion and/or electron yield to approximately 800° C. By means of permanent and/or electro-magnets, the magnet arrangement 29 generates the field B, preferably with a flux density of several 10 to several 100 gauss in the discharge space.

Because of the unusually low discharge voltages, as mentioned above, preferably in the range of from 20 to 35 V, a plasma potential of the discharge corresponding to (15) is obtained close to the anode potential. With respect to the potential, the workpiece or substrate potential can easily be adjusted such that the ion energies are below 15 eV, whereby ion-related damage during the layer growth on the workpiece can be completely avoided.

As mentioned above, a plasma density which is as high as possible must be endeavored on the workpiece. In the present case, the plasma density is defined by the current density at the workpiece surface. As indicated above, it is measured and set by means of probes in one calibrating operation.

The systems as illustrated schematically in FIGS. 1 and 2 currently are probably preferred embodiments. According to the method of the invention, they can definitely also be implemented on systems which are shown, for example, in German Patent Document DE-OS 36 14 384, if they are equipped and operated correspondingly. Up to now, the potential-controlled operation of the workpiece appears to be significant.

By means of a system as schematically illustrated in FIG. 2, R"-silicon monocrystal substrates are epitaxially coated with silicon or a silicon/germanium alloy. The volume of the recipient 1 amounted to 60 l.

The system was operated as follows:

Auxiliary anode 19 to potential of the recipient; workpiece holder 13 to controlled bias potential. Recipient as anode to ground.

The following operating point adjustments were made:
Workpiece Temperatures $T_S$:

In a plasma-induced manner, workpiece temperatures of only a few 100° C., thus, for example, of approximately 150° C., are obtained.

This is extremely advantageous for coating thermally critical substrates, such as organic substrates.

Higher desired temperatures are achieved by a separate heating. For producing Si and/or Ge layers and layers with Ge—Si bonding, workpiece temperatures $T_S$ $$300° C. \leq T_S \leq 600° C.$$

are advisable; for Ga layers or Ga bonding layers:

$$300° C. \leq T_S \leq 800° C.$$

are advisable.

Because the method is "cold", the temperature selection is very flexible, depending on the layer material and the substrate material.

|     | Flux (sccm) | Partial Pressure (mbar) |
| --- | --- | --- |
| Ar  | 50 | $6.8 \times 10^{-3}$ |
| $H_2$ | 5 | $7 \times 10^{-4}$ |
| $SiH_4$ | 10 | $10^{-3}$ |

Discharge Current $I_{AK}$: 70 A.
Discharge voltages $U_{AK}$: 25 V.
Substrate temperature: 550° V (heated by means of heater).

Figure 3:
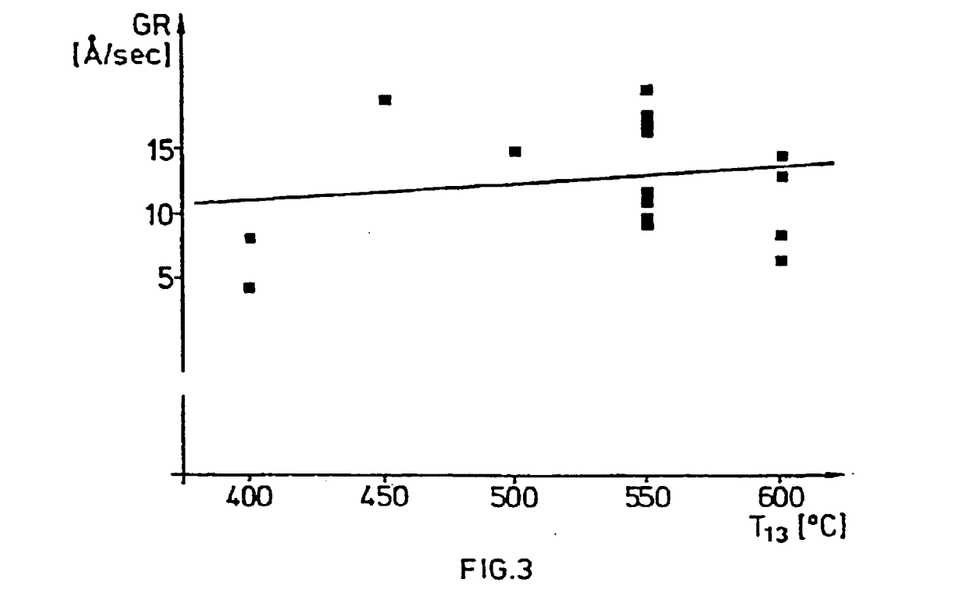
FIG. 3 is a view of the dependence of the growth rate on the wafer temperature during the operation of a system according to FIG. 2 for a silicon coating.

In a first test, the substrate temperature was varied by means of the heater 17. In this case, the other operating point parameters remain constant. FIG. 3 illustrates the result. This figure shows that the growth rate GR depends only very little on the workpiece temperature or substrate temperature $T_{13}$. The large scattering of the measured values is the result of the fact that, in the case of the test system, before each deposition, operating parameters in each case had to be adjusted again manually.

Based on the above-mentioned operating point values, the discharge current $I_{AK}$ was now varied by adjusting the discharge voltage $U_{AK}$ and optionally the variation of the cathode heating current. All other parameters were kept constant again. Although the discharge current $I_{AK}$ also does not correspond directly to the charge carrier density or the plasma density on the surface to be coated, nevertheless, while the parameters otherwise remain constant, the plasma density, corresponding to the current density on the workpiece surface to be coated, is essentially proportional to the discharge current. The result illustrated in FIG. 4 therefore definitely shows the proportionality and the proportionality factor between the growth rate GR and the plasma density. This proportionality should last as long as the gas utilization does not exceed approximately 60% and saturation effects occur. As mentioned above, the plasma density can be affected, in addition to, for example, by the adjustment of the discharge current, also by focussing or defocussing the low voltage discharge or by its deflection. Here also, the relatively large scattering is the result of the approach during the setting of the discharge conditions.

Figure 5:
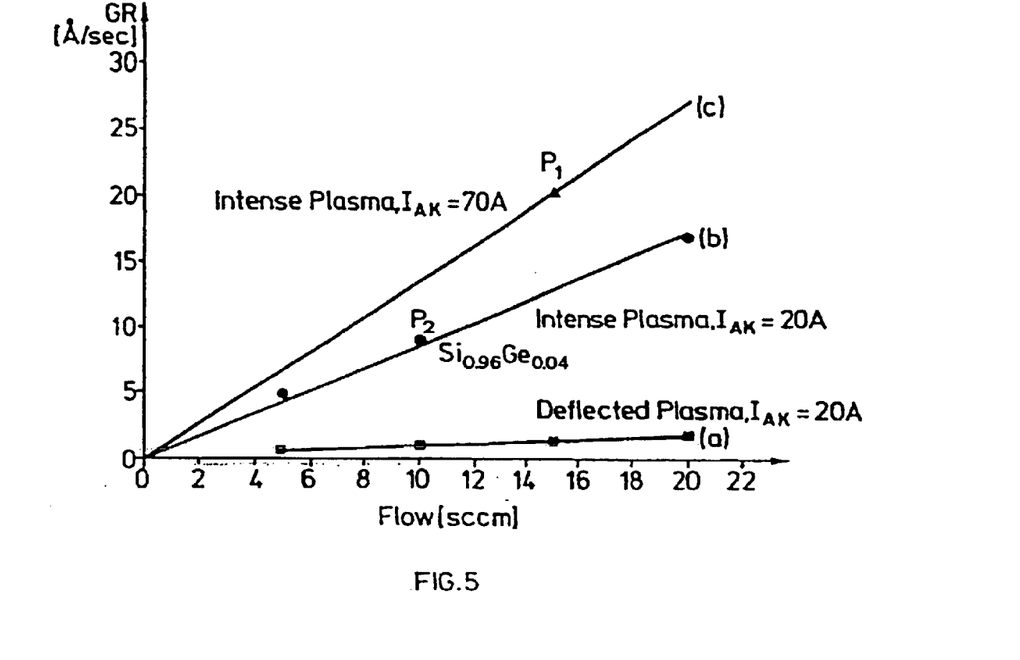
FIG. 5 is a view of the growth rate at different plasma densities in the area of the workpieces as a function of the reactive gas flow.

FIG. 5, finally, is very informative. It is the result of tests in which, while the parameters were otherwise kept constant, the reactive gas flow F was-varied, starting from the operating point 10 sccm. The straight line (a) was obtained with the low voltage discharge locally offset slightly with respect to the axis A of FIG. 1 by a magnetic field adjustment, which, on the substrate, resulted in a plasma density reduction or a lower rate, in the case of a discharge current $I_{AK}$ of 20 A.

Curve (b) shows the rate while the discharge is not deflected and at $I_{AK}$=20 A. Finally, (c) shows the increased rate while the discharge is not deflected with $I_{AK}$=70 A.

As confirmed in FIG. 3, a GR of approximately 15 Å/sec. is obtained in the case of a reactive gas flow of 10 sccm at a temperature of the substrate of 550° C. and 70 A discharge current $I_{AK}$.

Figure 4:
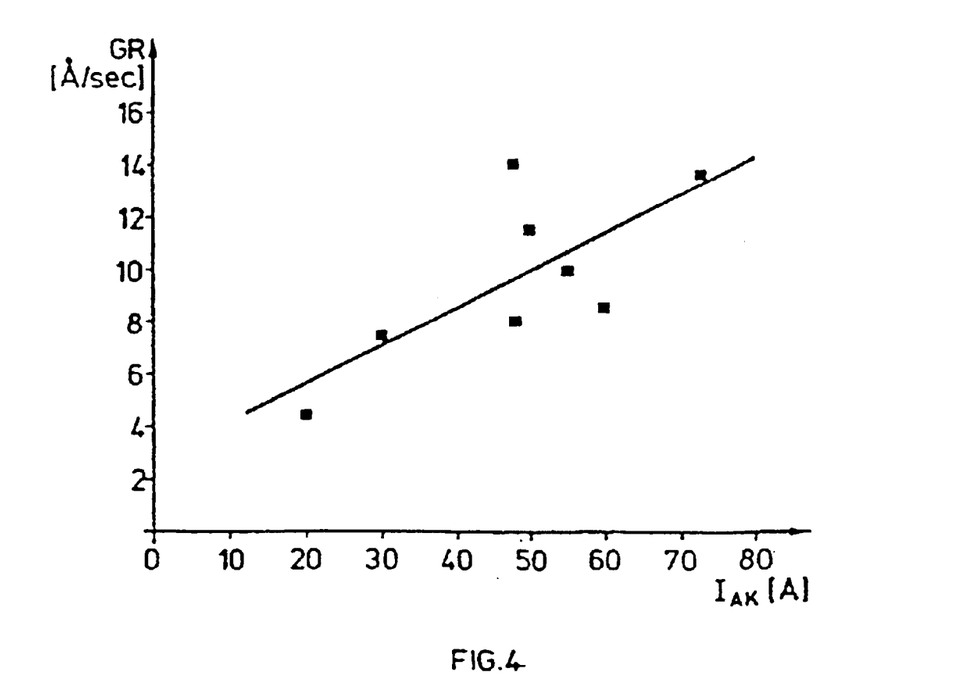
FIG. 4 is a view of the increase of the growth rate relative to the reactive gas flow $GR_r$ as a function of the discharge current.

In the case of a discharge current of 70 A with a reactive gas flow of 10 sccm, this result is also confirmed by FIG. 4. In the case of a discharge current of 20 A, the GR decreases to approximately 6 Å/sec.

The results according to the invention will now be compared with the results of the prior art.

a) Comparison with APCVD (2)

From FIG. 5, the following is obtained, for example, for point P1:

GR≈1200 Å/min, compared with

GR≈2×10$^{-2}$ Å/min in the case of the APCVD.

From FIG. 5, the following value is obtained for point P1:

$GR_F$ of 80 Å/(sccm.min)

The corresponding value in the case of APCVD amounts to:

$GR_F$≈2×10$^{-4}$ Å/(sccm.min)

When, in the case of the LEPECVD according to the invention, the gas utilization number is calculated for a 3" substrate, the following is obtained:

$GA_F$≈6, 11×10$^{-2}$, corresponding to approximately (illegible).

In this case, it should be taken into account that this number becomes significantly better as the substrate surface becomes larger, for example, on 5".

Figure 7:
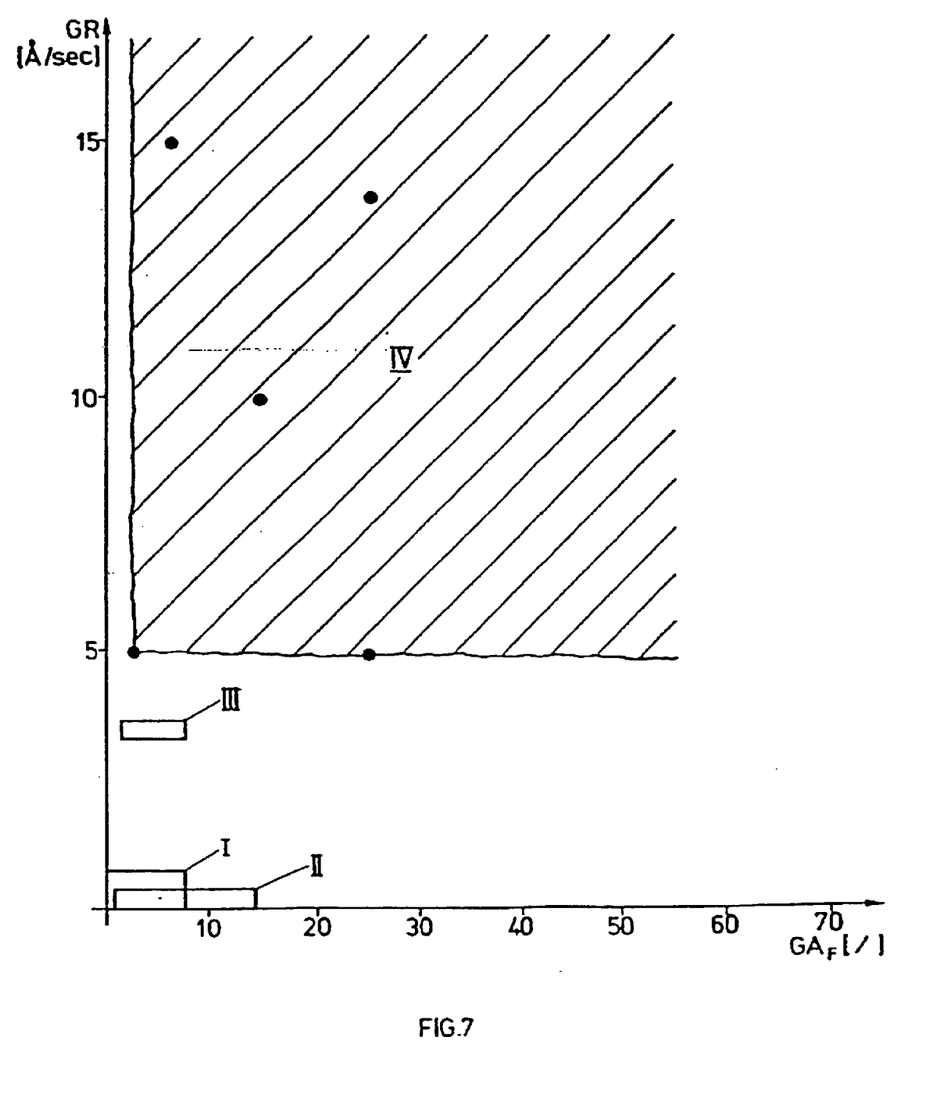
FIG. 7 is a view of the results according to the prior art and according to the invention in the growth rate/gas utilization number field.

FIG. 7 shows the following results:

In Field I: for ABCVD, LPCVD, RPECVD;

in Field II: for UHVCVD in Field III: for ECRCVD in Field IV: according to the present invention.

They apply to temperatures ≦600° C.

In this context, it should be stressed again that the approach according to the invention permits the coating of relatively large surfaces, whereby the gas utilization number $GA_P$ also rises.

If, analogously, the large growth rate GR, the growth rate per reactive gas flow unit $GR_F$, and the gas utilization number $GA_F$ are compared with the corresponding number for CVD at atmospheric pressure conditions, drastic improvements occur according to the invention in every respect. If finally the results according to the present invention are compared with those which are obtained when a PECVD method is operated by means of low-voltage discharge according to German Patent Document DE-OS 36 14 384, it is found that astonishingly the growth rate of 1200 Å/min achieved according to the invention is significantly higher than the highest growth rates achieved by means of the previously known methods and that, in addition, the growth rate per reactive gas flow unit $GR_F$ achieved according to the invention is virtually by two powers of ten higher.

It is therefore extremely surprising that by means of very specific operating conditions at the system, as they were known in principle from German Patent Document DE-OS 36 14 384, such improvements can be achieved, taking into account that the layers deposited according to the invention correspond to epitaxy conditions with respect to the density of defects.

This was examined in a very simple manner in that, in the case of the described operation of the system according to FIG. 2, with the indicated operating point parameters, when inserting a monocrystalline substrate, a high-quality epitaxy coating was achieved but, when an amorphous substrate was inserted, with the same operating point parameters, an amorphous coating was obtained.

Furthermore, the measuring point is illustrated at P2 in FIG. 5, if, instead of a pure Si layer, an SiGe epitaxy layer is deposited which contains 4% Ge.

Figure 6:
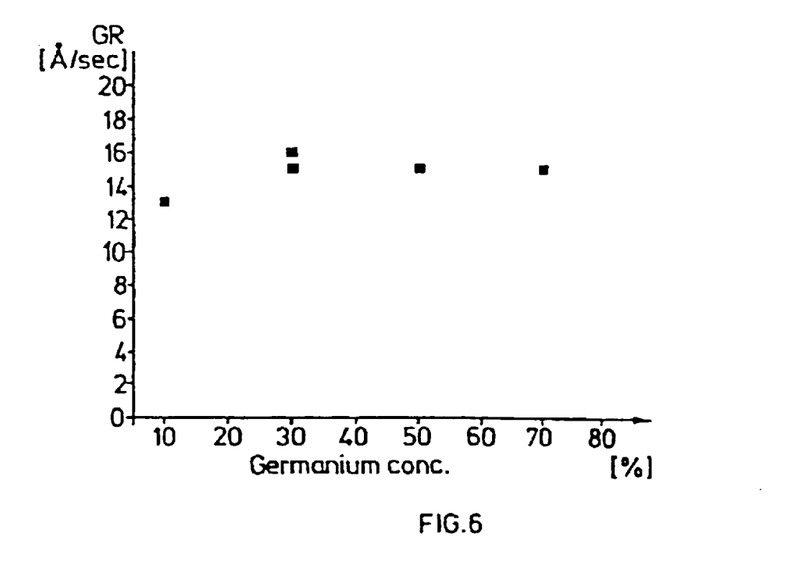
FIG. 6 is a view of the growth rate as a function of the germanium concentration on the deposited layer.

As indicated by the above, in contrast to the above-explained findings, in the case of the approach according to the invention, the conditions will not change when a Ge/Si alloy is deposited. This is confirmed by FIG. 6, where, as a function of the Ge content, the growth rate GR is indicated in % at the indicated operating points. This shows that the growth rate essentially does not change in a very large range of the Ge to Si ratio.

The approach according to the invention was primarily confirmed by means of attempts to deposit Se, Ge or Si/Ge alloy layers or GA and GA bonding layers, all in a doped and undoped condition.

By means of the approach according to the invention, in a combined manner, the highest layer quality is achieved while the deposition rates are very high and the efficiency is simultaneously very high as far as deposited layer material per admitted reactive gas quantity is concerned, and at low temperatures $\leq 600°$ C. Thus, the suggested approach is extremely well suited for industrial production, whether with respect to epitaxial layers or other layers of the highest quality.

Literature:
(1) Handbook of thin-film deposition processes and techniques, ed. Klaus K. Schuegraf, Noyes Publications, New Jersey, U.S.A., 1988, ISBNN 0-8155-1153-1
(2) Atmospheric pressure chemical vapor deposition of Si and SiGe at low temperatures, T. O. Sedgwick and P.D. Agnello, J. Vac.Sci.Technol. A10, 1913 (1992)
(3) Submicron highly doped Si layers grown by LPVPE, L. Vescan, H. Beneking and O. Meyer, J. Cryst. Growth 76, 63 (1986)
(4) Low-temperature silicon epitaxy by ultrahigh vacuum/ chemical vapor deposition, B. S. Meyerson, Appl. Phys. Lett. 48, 797 (1986),
(5) Cooperative growth phenomena in silicon/germanium low-temperature epitaxy, B. S. Meyerson, K. J. Uram, and F. K. LeGoues, Appl. Phys. Lett. 53, 2555 (1988),
(6) Silicon epitaxy at 650–800° C. using low-pressure chemical vapor deposition both with and without plasma enhancement, T. J. Donahue and R. Reif. J. App. Phys. 57, 2757 (1985)
(7) Low temperature silicon epitaxy by hot wall ultrahigh vacuum low pressure chemical vapor deposition techniques: Surface optimazion, B. S. Meyerson, E. Ganin, D. A. Smith, and T. N. Nguyen, J. Electrochem. Soc. 133, 1232 (1986)
(8) Kinectics of surface reactions in very low-pressure chemical vapor deposition of Si from $SiH_4$. S. M. Gates and S. K. Kulkarni, Appl. Phys. Lett. 58, 2963 (1991)
(9) Electron cyclotron resonance assisted low temperature ultrahigh vacuum chemical vapor deposition of Si using silane, D. S. Mui, S. F. Fang, and H. Morkoc, Appl. Phys. Lett. 59, 1887 (1991)
(10) Low-temperature silicon homoepitaxy by ultrahigh vacuum electron cyclotron resonance chemical vapor deposition, H-S. Tae, S-H. Hwang, S-J. Park, E. Yoon, and K-W. Whang, Appl. Phys. Lett. 64, 1021 (1994),
(11) Epitaxial growth of Silicon from $SiH_4$, in the temperature range 8000–1150° C. W, W. G. Townsend and M. E. Uddin, Solid State Electron 16, 39 (1973)
(12) Homoepitaxial films grown on Si(100) at 150° C. by remote plasma-enhanced chemical vapor deposition, L. Breaux, B. Anthony, T. Hsu, B. Banerjee, and A. Tasch. Appi. Phys. Lett. 55, 1885 (1989).
(13) Growth of $Ge_xSi_1/Si$ heteroepitaxial films by remote plasma chemical vapour deposition, R. Qian, D. Kinosky, T. Hsu, J. Irby, A. Mahajan, S. Thomas, B. Anthony, S. Banerjee, A. Tasch, L. Rabenberg and C. Magee, J. Vac. Sci. Technol. A 10, 1920 (1992)
(14) Low temperature epitaxial silicon film growth using high vacuum electron-cyclotron-resonance plasma deposition, S. J. DeBoer, V. L. Dalal, G. Chumanov, and R. Bartels, Appl. Phys. Lett. 66, 2528 (1995).
(15) Hydrogen plasma chemical cleaning of metallic substrates and Silicon wafers; W. Korner et al., Balzers Ltd., Liech-tenstein, Surface and coatings technology, 76–77 (1995) 731–737.

What is claimed is:

1. A system for implementing a method for producing workpieces coated by PECVD with a quality sufficient for epitaxy, comprising a vacuum recipient, a plasma discharge source operationally connected to said vacuum recipient so as to generate in said vacuum recipient a low voltage plasma discharge not of the cathode spot forming-type, a workpiece holder within said vacuum recipient, said plasma discharge source being configured to generate on said workpiece holder ions with an energy of below 15 eV, a heater for a substrate deposited on said workpiece holder, said heater being configured to be independently controllable from said plasma discharge source, a gas feed to said vacuum recipient from a gas tank containing a reactive gas, and a turbomolecular pump operationally connected to said vacuum recipient to provide for a pressure in said vacuum recipient in a low pressure range suitable for epitoxial-coating quality.

2. The system of claim 1, wherein said low-voltage discharge source comprises at least one cathode within a cathode chamber, said cathode chamber being coupled to said vacuum recipient by a diaphragm.

3. The system of claim 1, wherein said workpiece holder is mounted in said recipient in an electrically insulated manner.

4. The system of claim 1, wherein said workpiece holder is connected to a biasing generator.

5. The system of claim 1, wherein said plasma discharge source comprises at least one cathode and at least one anode and wherein a wall of said vacuum recipient assumes the same electric potential as said anode.

6. The system of claim 1, wherein said plasma discharge source comprises at least one cathode and at least one anode and wherein said anode and said cathode are operationally connected to an electric supply generating at said cathode an electric potential which is between 10 and 80 V with respect to electric potential of said anode.

7. The system of claim 6, wherein said electric potential applied to said cathode is between 20 and 35 V with respect to said electric potential applied to said anode.

8. The system of claim 1, wherein said plasma discharge source comprises at least one cathode and at least one anode and wherein said workpiece holder is operationally connected to a biasing electric supply applying to said workpiece holder an electric potential, which is adjustable by at most ±25 V with respect to an electric potential of said anode.

9. The system of claim 1, wherein said plasma discharge source comprises at least one cathode and at least one anode, said anode being formed by a wall of said vacuum recipient.

10. The system of claim 1, wherein said plasma discharge source comprises at least one cathode and at least one anode and wherein said anode is mounted within said recipient in an electrically isolated manner.

11. The system of claim 1, wherein said plasma discharge source comprises at least one cathode and at least one anode and wherein said workpiece holder is mounted within said recipient in an electrically isolated manner so that, in operation, said workpiece holder assumes an electric potential with respect to an electric potential of said anode, which is not more negative than −25V.

12. The system of claim 11, wherein said workpiece holder assumes an electric potential of between −3 V and −15 V with respect to said electric potential of said anode.

13. The system of claim 1, wherein said workpiece holder is operationally connected to a biasing electric supply.

14. The system of claim 13, wherein said biasing electric supply generates at said workpiece holder an electric potential of between −25 V and +25 V with respect to an electric potential of said anode.

15. The system of claim 14, wherein said supply generates at said workpiece holder said potential to be negative.

16. The system of claim 15, wherein said negative potential is between −15 V and −3 V.

17. The system of claim 1, wherein said plasma discharge source comprises an anode, an auxiliary anode and at least one cathode.

18. The system of claim 1, wherein said plasma discharge source comprises at least one cathode arranged in a cathode chamber, said cathode chamber being coupled to said recipient via a diaphragm and wherein there is provided an annular anode arranged within said recipient coaxially with an axis of said diaphragm.

19. The system of claim 18, wherein said anode is operationally connected to an electric supply generating at said anode an electric potential which is equal to or which is different from an electric potential of a wall of said recipient.

20. The system of claim 1, wherein a wall of said recipient is mounted in an electrically floating manner.

21. The system of claim 1, wherein a wall of said recipient is operationally connected via an impedance element onto an electric reference potential.

22. The system of claim 21, wherein said impedance element is a resistor element.

23. The system of claim 1, wherein said plasma discharge source comprises at least one cathode formed by an electron emitter and at least one anode and that said cathode and said anode are operationally connected to an electric supply supplying a voltage $U_{AK}$ between said cathode and said anode to be $$10 \text{ V} \leq U_{AK} \leq 80 \text{ V}.$$

24. The system of claim 23, wherein said voltage $U_{AK}$ is $$20 \text{ V} \leq U_{AK} \leq 35 \text{ V}.$$

25. The system of claim 1, wherein said plasma discharge source comprises at least one cathode and at least one anode arrangement and wherein said anode arrangement is operationally connected to an electric supply providing thereat a maximum electric potential and wherein further said workpiece holder is operationally connected to a further electric supply providing at said workpiece holder an electric potential defining an electric voltage $U_S$ with respect to said maximum potential which is $$-25 \text{ V} \leq U_S \leq +25 \text{ V}.$$

26. The system of claim 25, wherein said voltage $U_S$ is negative.

27. The system of claim 26, wherein said negative voltage $U_S$ is $$-15 \text{ V} \leq U_S -3 \text{ V}.$$

28. The system of claim 1, wherein said plasma discharge source comprises at least one cathode being a hot cathode.

29. The system of claim 1, wherein said plasma discharge source comprises at least one cathode mounted within a cathode chamber communicating with said recipient and further comprising a gas feed to said cathode chamber communicating with a working-gas tank.

30. The system of claim 29, wherein said working gas tank is filled with argon.

31. The system of claim 1, wherein said plasma discharge source comprises at least one cathode within a cathode chamber, said cathode chamber communicating with said recipient via a diaphragm and further comprising a magnet arrangement generating within said recipient a magnetic field substantially parallel to an axis of said diaphragm.

32. The system of claim 31, wherein said magnetic field within said recipient is substantially aligned around said axis.

33. The system of claim 31, wherein said magnet arrangement comprises at least one of permanent magnets and of electromagnets.

34. The system of claim 1, wherein said plasma discharge source comprises at least one electron-emitting cathode emitting an electron current of between 5 and 400 A.

35. The system of claim 34, wherein said current is between 20 and 100 A.

36. The system of claim 1, wherein said plasma discharge source generates within said recipient electrons with a maximum electron density at a predetermined locus and that said workpiece holder is mounted adjacent to said locus.

37. The system of claim 1, wherein said plasma discharge source comprises at least one cathode mounted within a cathode chamber, said cathode chamber communicating with said recipient via a diaphragm defining an axis, said workpiece holder being substantially aligned concentrically to said axis.

38. The system of claim 1, wherein said gas tank comprises at least one of silicon containing, germanium containing, gallium containing gas.

39. The system of claim 38, wherein said gas tank further contains hydrogen.

40. The system of claim 1, wherein said plasma discharge source is operationally connected to a DC generator.

* * * * *

UNITED STATES PATENT AND TRADEMARK OFFICE
CERTIFICATE OF CORRECTION

PATENT NO.    : 6,918,352 B2
DATED         : July 19, 2005
INVENTOR(S)   : Von Kanel et al.

It is certified that error appears in the above-identified patent and that said Letters Patent is hereby corrected as shown below:

The title page, showing an illustrative figure, should be deleted and substitute the attached title page.

Delete drawing sheets 1-4, and substitute the drawing sheets, consisting of Figs. 1-7 as shown on the attached pages.

Signed and Sealed this

Twenty-eighth Day of February, 2006

JON W. DUDAS
*Director of the United States Patent and Trademark Office*

(12) United States Patent
Von Känel et al.

(10) Patent No.: US 6,918,352 B2
(45) Date of Patent: Jul. 19, 2005

(54) METHOD FOR PRODUCING COATED WORKPIECES, USES AND INSTALLATION FOR THE METHOD (75) Inventors: Hans Von Känel, Wallisellen (CH); Carsten Rosenblad, Zürich (CH); Jurgen Ramm, Sevelen (CH)

(73) Assignee: Unaxis Trading AG, Trübbach (CH)

( * ) Notice: Subject to any disclaimer, the term of this patent is extended or adjusted under 35 U.S.C. 154(b) by 0 days.

(21) Appl. No.: 10/199,050

(22) Filed: Jul. 22, 2002

(65) Prior Publication Data

US 2003/0005879 A1 Jan. 9, 2003

Related U.S. Application Data

(62) Division of application No. 09/460,210, filed as application No. PCT/CH98/00221 on May 27, 1998, now Pat. No. 6,454,855.

(30) Foreign Application Priority Data

Jun. 13, 1997 (CH) ............................................. 1445/97

(51) Int. Cl.$^7$ ................................................. C23C 16/00
(52) U.S. Cl. ........................ 118/723 DC; 118/723 HC; 118/723 E
(58) Field of Search ................... 118/723 DC, 723 HC, 118/723 CB, 723 EB, 723 FI, 723 FE, 723 E; 117/92, 103, 108

(56) References Cited

U.S. PATENT DOCUMENTS

| | | | | |
|---|---|---|---|---|
| 4,440,108 A | * | 4/1984 | Little et al. ................ | 118/719 |
| 4,443,488 A | | 4/1984 | Little et al. | |
| 4,488,506 A | * | 12/1984 | Heinecke et al. ............ | 118/667 |
| 4,749,587 A | * | 6/1988 | Bergmann et al. .......... | 427/570 |
| 4,989,544 A | * | 2/1991 | Yoshikawa ............ | 118/723 MP |
| 5,009,922 A | * | 4/1991 | Harano et al. ............. | 427/571 |
| 5,052,339 A | * | 10/1991 | Vakerlis et al. ........... | 118/723 E |
| 5,104,509 A | * | 4/1992 | Buck et al. ............. | 204/192.38 |
| 5,384,018 A | * | 1/1995 | Ramm et al. ........... | 204/192.38 |
| 5,554,222 A | | 9/1996 | Nishihara et al. | |
| 5,580,420 A | * | 12/1996 | Watanabe et al. ............. | 216/69 |
| 5,730,808 A | * | 3/1998 | Yang et al. .................. | 136/249 |
| 5,952,061 A | * | 9/1999 | Yoshida et al. ............. | 427/580 |
| 6,139,964 A | * | 10/2000 | Sathrum et al. ............ | 428/408 |

FOREIGN PATENT DOCUMENTS

| | | |
|---|---|---|
| DE | 36 14 384 | 1/1987 |
| GB | 2 219 578 | 12/1989 |

OTHER PUBLICATIONS

"Plasma-Enhanced Chemical Vapor Deposition of Epitaxial Silicon From Silane", S.R. Shanfield, Ext. Abstracts, vol. 83-1, 1983, pp. 230-231, XP002056339, no month.
"Low Temperature Deposition of Microcrystalline Silicon In A Multipolar Plasma", T.D. Mantei et al. Ext. Abstr., vol. 85, No. 2, 1985, pp. 396-397, XP002056340, no month.
"Plasma-Assisted CVD of Diamond Films By Hollow Cathode ARC Discharge" Diamond and Related Materials, vol., 2, No. 2/04, Mar. 31, 1993, pp. 413-416, XP000360820.

(Continued)

*Primary Examiner*—Parviz Hassanzadeh
(74) *Attorney, Agent, or Firm*—Crowell & Moring LLP

(57) ABSTRACT

A system and a method produce workpieces coated by PECVD with a quality sufficient for epitaxy. Included are a vacuum recipient, a plasma discharge source operationally connected to the vacuum recipient and a workpiece holder within the vacuum recipient, said plasma discharge source generating on said workpiece holder ions with an energy of below 15 eV. The plasma discharge source can be a low-voltage plasma discharge source in which at least one cathode is arranged within a cathode chamber coupled to the vacuum recipient by a diaphragm.

40 Claims, 4 Drawing Sheets